(12) United States Patent
Lee

(10) Patent No.: US 7,429,512 B2
(45) Date of Patent: Sep. 30, 2008

(54) METHOD FOR FABRICATING FLASH MEMORY DEVICE

(75) Inventor: Dong Kee Lee, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 309 days.

(21) Appl. No.: 11/438,991

(22) Filed: May 23, 2006

(65) Prior Publication Data

US 2007/0020847 A1 Jan. 25, 2007

(30) Foreign Application Priority Data

Jul. 25, 2005 (KR) .................. 10-2005-0067364

(51) Int. Cl.
*H01L 21/336* (2006.01)

(52) U.S. Cl. .............. 438/257; 438/248; 438/264; 438/266; 438/286; 438/296; 257/E21.619

(58) Field of Classification Search .......... 438/228, 438/248, 264
See application file for complete search history.

(56) References Cited

U.S. PATENT DOCUMENTS

2002/0123180 A1* 9/2002 Rabkin et al. ............... 438/197

FOREIGN PATENT DOCUMENTS

KR    1020010061414 A    7/2001

* cited by examiner

*Primary Examiner*—Walter L. Lindsay, Jr.
*Assistant Examiner*—Kyoung Lee
(74) *Attorney, Agent, or Firm*—Marshall Gerstein & Borun LLP

(57) ABSTRACT

A method of fabricating a flash memory device. A DDD ion is implanted into a high voltage PMOS transistor and into source and drain junctions of a cell transistor in order to facilitate a pinch-off phenomenon in the gate to drain overlap region and also increase the number of hot carriers. Accordingly, a program characteristic can be improved, a depletion width between source and drain junctions of a cell can be narrowed and the leakage current can be reduced.

12 Claims, 6 Drawing Sheets

METHOD FOR FABRICATING FLASH MEMORY DEVICE

BACKGROUND

1. Field of the Invention

The invention relates to a method of fabricating a flash memory device and, more particularly, to a method of fabricating a flash memory device in which a program characteristic can be improved and the leakage current can be reduced.

2. Discussion of Related Art

In stacked gate type flash EEPROM devices, when cells are driven, pinch off is generated in the gate to drain the overlap region as the depletion region of the drain junction region shrinks. The strong electric field so generated accordingly generates hot carriers, and electrons of the hot carriers accumulate on the floating gate.

FIGS. 1A to 1C are cross-sectional views illustrating process steps of a method of fabricating a flash memory device in the related art. FIG. 1 shows a junction formation process of a cell region and a high voltage PMOS transistor formation region.

As shown in FIG. 1A, a tunnel oxide layer 11 is formed on a semiconductor substrate 10 in which an active region is defined by an isolation film (not shown). A cell transistor gate in which a floating gate 12, a dielectric layer 13, and a control gate 14 are stacked is then formed in the cell region. A PMOS transistor gate in which conduction layers for the floating gate 12 and the control gate 14 are stacked is formed in the high voltage PMOS transistor formation region.

Thereafter, a first source junction 15 is formed by a source ion implant process employing a cell source mask, and an annealing process is then implemented.

Though not shown in the drawings, a Double Doped Drain (DDD) ion implant process is then performed on the high voltage NMOS transistor formation region.

A first photoresist PR1 through which the high voltage PMOS transistor formation region is exposed is then formed. A DDD ion implant process using the first photoresist PR1 as a mask is carried out on the high voltage PMOS transistor formation region, thus forming first and second P− junctions 16, 17 within the semiconductor substrate 10 on both sides of the PMOS transistor gate. The first photoresist PR1 is then stripped.

A common source line is then formed by a Self Aligned Source (SAC) etch process, an ion implant process, and an annealing process.

As shown in FIG. 1B, a second photoresist PR2 through which the cell region is exposed is then formed. A cell source/drain ion implant process is then performed to form a second source junction 18 and a drain junction 19. The second photoresist PR2 is then stripped.

With reference to FIG. 1C, an insulating layer (not shown) is deposited on the entire structure. The insulating layer is etched back to form spacers 20 on both sides of the cell transistor gate and the PMOS transistor gate.

Though not shown in the drawings, a junction region is formed in the high voltage NMOS transistor formation region. A third photoresist PR3 through which the high voltage PMOS transistor formation region is exposed is formed. A P+ ion implant process is performed to form first and second P+ junctions 21, 22 within the first and second P− junction 16, 17, respectively. The third photoresist PR3 is then stripped.

In the stacked gate type NOR flash device constructed above, about ten kinds of transistors are used, in terms of device characteristics. This requires many processes in forming the junctions of each transistor. For this reason, before the gates are formed, several threshold voltage ion implant processes must be performed in order to satisfy the threshold voltage of each transistor. The threshold voltage ion implant process and the junction ion implant process are necessarily required in terms of device characteristics.

As the gate length reduces below the sub micron level, however, a leakage current is generated between the source and drain junctions of the cells, and a program characteristic is degraded accordingly. To compensate for the degradation of the program characteristic, a cell threshold voltage ion implant process dosage is increased. If the dosage is increased, the cell threshold voltage rises and the cell current can be lowered accordingly.

As there is a tendency in which the gate length reduces below the sub micron level, leakage occurs between the source junction and the drain junction, thereby degrading a program characteristic.

To compensate for the degradation of the program characteristic, a threshold voltage ion implant process is performed. It is, however, very difficult to solve the leakage problem occurring between the source junction and the drain junction through this process. That is, to reduce the leakage problem between the source junction and the drain junction of the cell, the dose of the threshold voltage ion is increased. If the dose is increased as described above, the threshold voltage of the cell rises and the cell current is lowered accordingly. In addition, a disadvantage in which the cell current is lowered out weights an advantage in which the program characteristic is improved. Accordingly, there are no significant advantages.

To solve the above-mentioned problems, a method of adding ions to the channel region of the cell or changing the junction structure has been used. However, these methods increase the process step number and raise the manufacturing cost.

SUMMARY OF THE INVENTION

An embodiment of the invention relates to a method of fabricating a flash memory device, in which when implanting a DDD ion into the high voltage PMOS transistor, the ion is also implanted into the source and drain junctions of a cell transistor in order to facilitate a pinch-off phenomenon in the gate to drain overlap region and also increase the number of hot carriers, whereby a program characteristic can be improved, a depletion width between source and drain junctions of the cell can be narrowed, and the leakage current can be reduced.

A method of fabricating a flash memory device according to a first embodiment of the invention includes the steps of forming transistors in a cell region and high voltage PMOS and NMOS transistor formation regions on a semiconductor substrate, respectively, forming a source region by a source ion implant process, implanting a Double Doped Drain (DDD) ion into the cell region and the high voltage PMOS transistor formation region to form a first source junction and a first drain junction in the cell region and to form first and second P− junctions in the high voltage PMOS transistor formation region, performing a cell source/drain ion implant process on the cell region to form a second source junction and a second drain junction in the first source junction and the first drain junction, respectively, and forming spacers on the sides of a cell gate and a PMOS transistor gate and a NMOS transistor gate, and performing an ion implant process on the high voltage PMOS transistor formation region to form first and second P+ junctions in the first and second P− junctions.

A method of fabricating a flash memory device according to a second embodiment of the invention includes the steps of forming transistors in a cell region, and high voltage PMOS and NMOS transistor formation regions on a semiconductor substrate, respectively, forming a source region by a source ion implant process, implanting DDD ion into a source region of the cell region and the high voltage PMOS transistor formation region to form a first source junction in the cell region and to form first and second P− junctions in the high voltage PMOS transistor formation region, performing a cell source/drain ion implant process on the cell region to form a second source junction and a drain junction, and forming spacers on the sides of a cell gate and a PMOS transistor gate and a NMOS transistor gate, and performing an ion implant process on the high voltage PMOS transistor formation region to form first and second P+ junctions within the first and second P− junctions.

A method of fabricating a flash memory device according to a third embodiment of the invention includes the steps of forming transistors in a cell region and high voltage PMOS and NMOS transistor formation regions on a semiconductor substrate, respectively, forming a source region by a source ion implant process, implanting a DDD ion into a drain region of the cell region and the high voltage PMOS transistor formation region to form a first drain junction in the cell region and to form first and second P− junctions in the high voltage PMOS transistor formation region, performing a cell source/drain ion implant process on the cell region to form a source junction and a second drain junction, and forming spacers on the sides of a cell gate and a PMOS transistor gate and a NMOS transistor gate, and performing an ion implant process on the high voltage PMOS transistor formation region to form first and second P+ junctions within the first and second P− junctions.

BRIEF DESCRIPTION OF THE DRAWINGS

A more compete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION

Figure 1A:
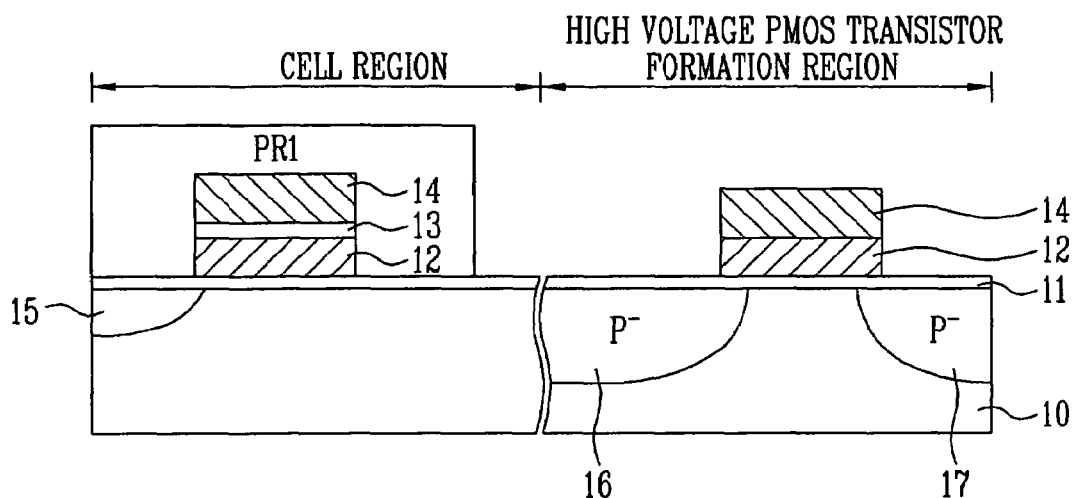
FIGS. 1A to 1C are cross-sectional views illustrating process steps of a method of fabricating a flash memory device in the related art.
Figure 1B:
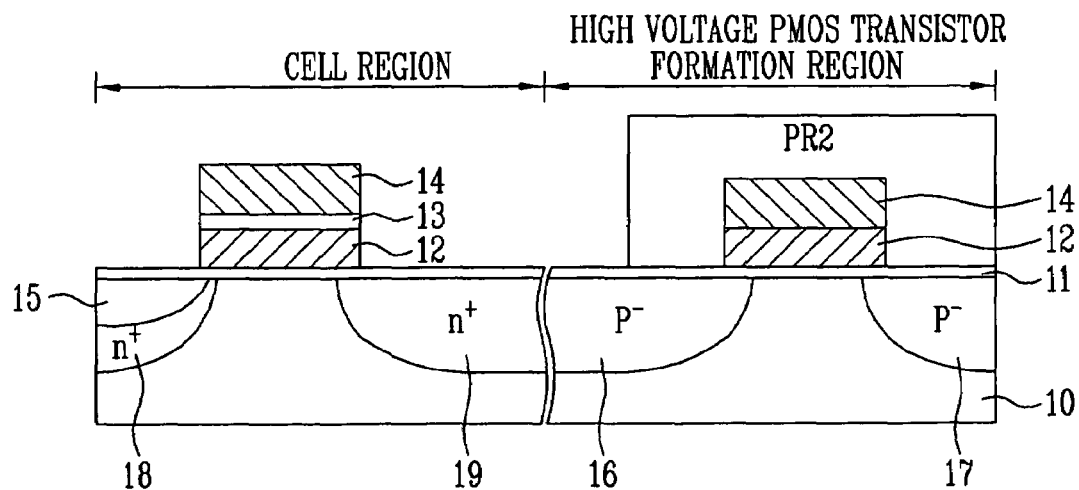
Figure 1C:
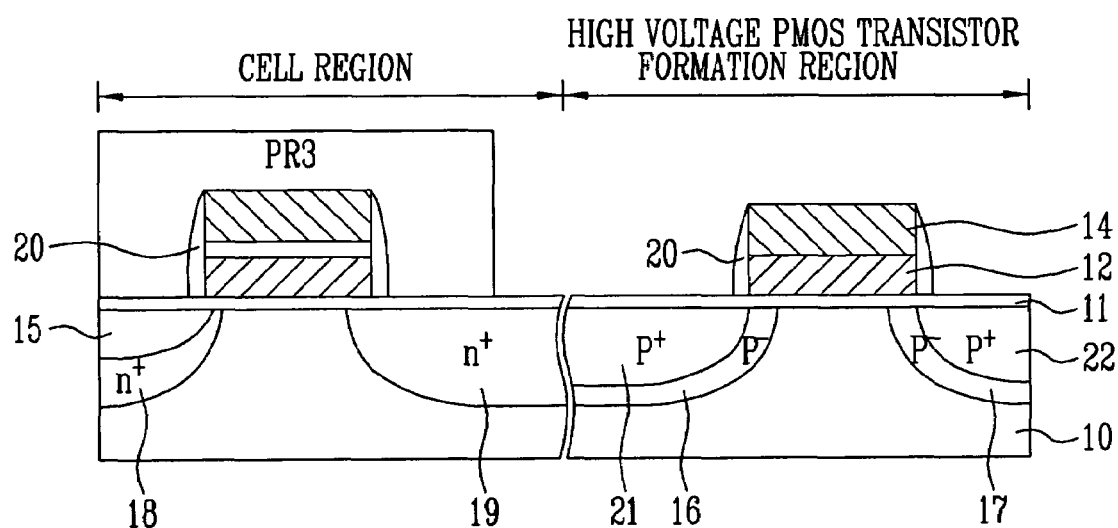

In the following detailed description, only certain exemplary embodiments of the invention have been shown and described simply by way of illustration. As those skilled in the art will realize, the described embodiments may be modified in various different ways, all without departing from the spirit or scope of the present invention. Accordingly, the drawings and description are to be regarded as illustrative in nature and not restrictive. Like reference numerals designate like elements throughout.

First Embodiment

Figure 2A:
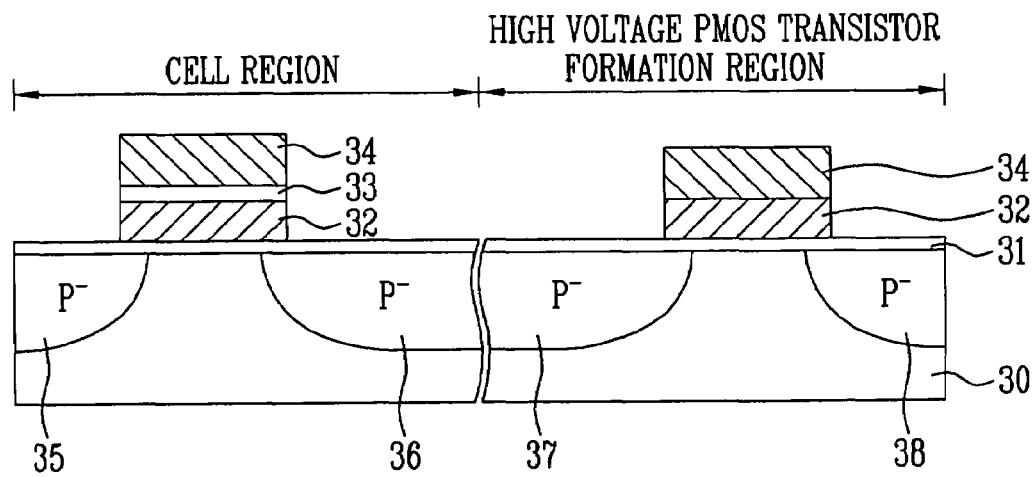
FIGS. 2A to 2C are cross-sectional views illustrating process steps of a method of fabricating a flash memory device according to a first embodiment of the invention.
Figure 2B:
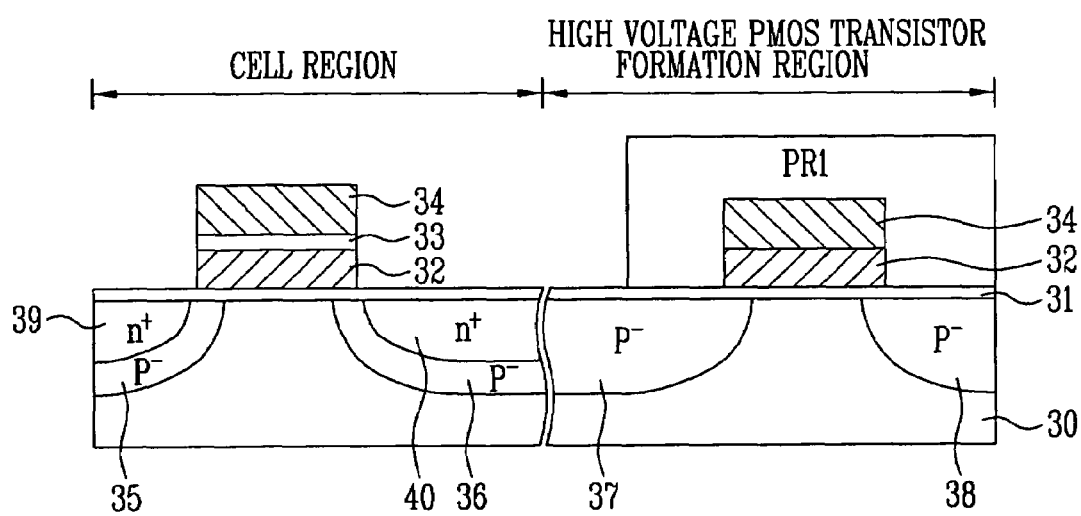
Figure 2C:
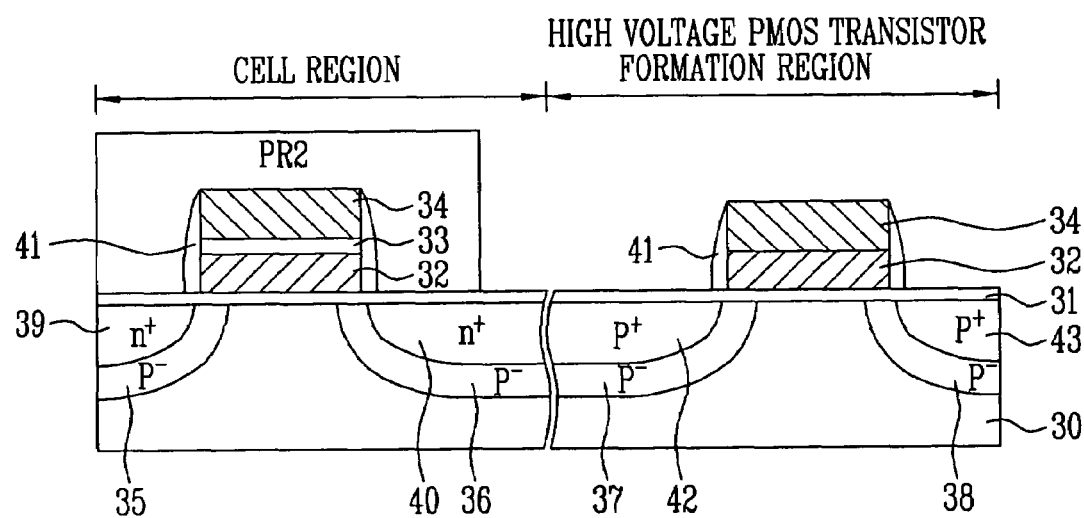

FIGS. 2A to 2C are cross-sectional views illustrating process steps of a method of fabricating a flash memory device according to a first embodiment of the invention. FIG. 2 shows a process of forming the junctions of the cell region and the high voltage PMOS transistor formation region.

As shown in FIG. 2A, a tunnel oxide layer 31 is formed on a semiconductor substrate 30 in which an isolation process has been performed. A cell gate in which a floating gate 32, a dielectric layer 33 and a control gate 34 are stacked is formed in a cell region. A PMOS transistor gate in which conduction layers for the floating gate 32 and the control gate 34 are stacked is formed in a high voltage PMOS transistor formation region.

A source ion implant process employing a cell source mask is performed to form a source region and an annealing process is then performed.

Though not shown in the drawings, a DDD ion implant process is then performed on the high voltage NMOS transistor formation region.

An HVP DDD mask through which the cell region and the high voltage PMOS transistor formation region are exposed is formed. An HVP DDD ion implant process using the HVP DDD mask is performed to form a first source junction 35 and a first drain junction 36 in the cell region and first and second P− junctions 37, 38 in the high voltage PMOS transistor formation region.

In the related art, the dose is set to 3.0E13 ions/cm³ to 5.0E13 ions/cm³ in the HVP DDD ion implant process. In this case, a depth of an impurity (for example, boron), which is formed in the cell junction, is too deep. Accordingly, there is a possibility that advantages which will be obtained in the embodiments of the invention may be adversely affected. Accordingly, the dose may be lowered to about 1.0E12 ions/cm³ to 2.0E13 ions/cm³.

An SAS etch process, an ion implant process, and an annealing process are then performed to form a common source line.

As shown in FIG. 2B, a first photoresist PR1 through which the cell region is exposed is formed. A cell source/drain ion implant process is carried out to form a second source junction 39 and a second drain junction 40 within the first source junction 35 and the first drain junction 36, respectively. Thereby, the source and drain junctions of the cell region have a pocket structure.

Thereafter, the first photoresist PR1 is stripped. As shown in FIG. 2C, an insulating layer is deposited on the entire structure and is then etched back to form spacers 41 on both sides of the cell gate and the PMOS transistor gate. Though not shown in the drawings, a junction region is formed in the high voltage NMOS transistor formation region and a second photoresist PR2 through which only the high voltage PMOS transistor formation region is exposed is formed.

A P+ ion implant process is performed using the second photoresist PR2 as a mask, thus forming first and second P+ junctions 42, 43 within the first and second P− junctions 37, 38, respectively. The second photoresist PR2 is then stripped.

Second Embodiment

Figure 3A:
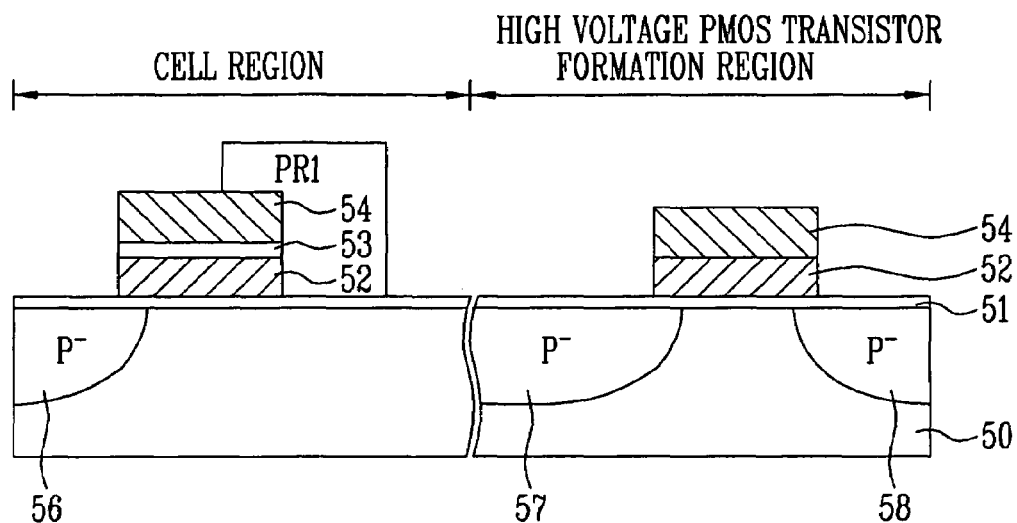
FIGS. 3A to 3C are cross-sectional views illustrating process steps of a method of fabricating a flash memory device according to a second embodiment of the invention.
Figure 3B:
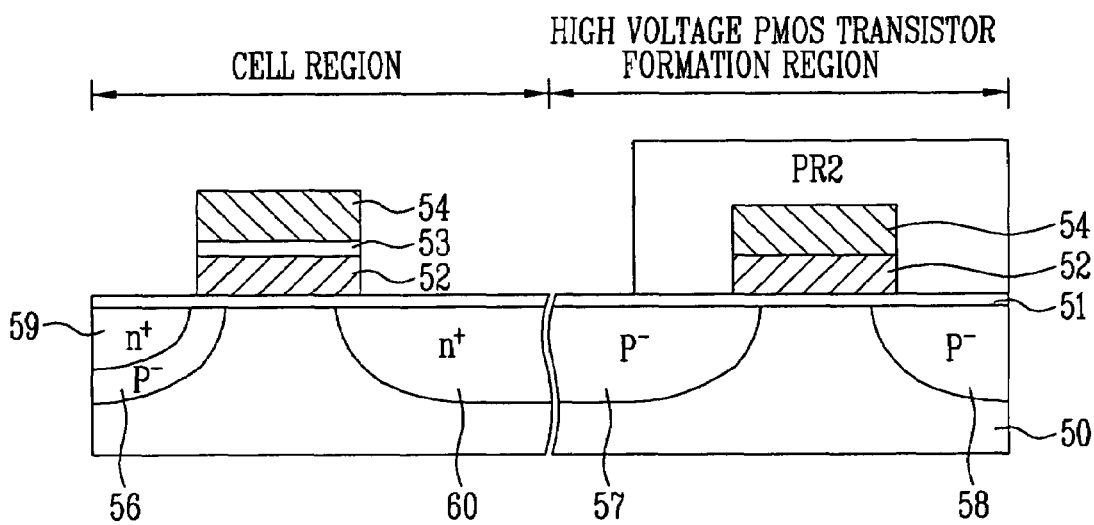
Figure 3C:
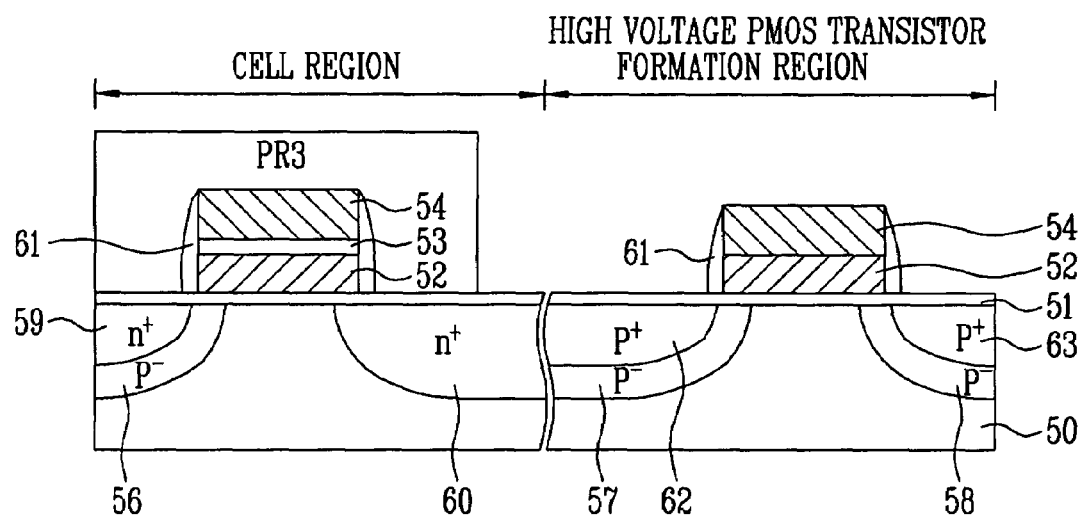

FIGS. 3A to 3C are cross-sectional views illustrating process steps of a method of fabricating a flash memory device according to a second embodiment of the invention. FIG. 3 shows the process of forming the junctions of the cell region and the high voltage PMOS transistor formation region.

As shown FIG. 3A, a tunnel oxide layer 51 is formed on a semiconductor substrate 50 in which an isolation process has been performed. A cell gate in which a floating gate 52, a dielectric layer 53, and a control gate 54 are stacked is formed in a cell region. A PMOS transistor gate in which conduction layers for the floating gate 52 and the control gate 54 are stacked is formed in a high voltage PMOS transistor formation region. A source ion implant process employing a cell source mask is performed to form a source region and an annealing process is then performed. Thereafter, though not shown in the drawings, a DDD ion implant process is performed on the high voltage NMOS transistor formation region.

Thereafter, a first photoresist PR1 through the source region of the cell region and the high voltage PMOS transistor formation region are exposed is formed. An HVP DDD ion implant process using the first photoresist PR1 as a mask is performed to form a first source junction 56 in the cell region and first and second P− junctions 57, 58 in the high voltage PMOS transistor formation region. The first photoresist PR1 is stripped.

In the related art, the dose is set to 3.0E13 ions/cm$^3$ to 5.0E13 ions/cm$^3$ in the HVP DDD ion implant process. In this case, however, a depth of an impurity (for example, boron), which is formed in the cell junction, is too deep. Accordingly, there is a possibility that advantages which will be obtained in the embodiments of the present invention may be adversely affected. Accordingly, the dose may be lowered to about 1.0E12 ions/cm$^3$ to 2.0E13 ions/cm$^3$.

An SAS etch process, an ion implant process, and an annealing process are then performed to form a common source line.

As shown in FIG. 3B, a second photoresist PR2 through which the cell region is exposed is formed and a cell source/drain ion implant process is then performed to form a second source junction 59 and a drain junction 60. The second photoresist PR2 is stripped. The second source junction region 59 is formed within the first source junction region 56. Accordingly, the source junction of the cell region has a pocket structure.

As shown in FIG. 3C, an insulating layer is deposited on the entire structure and is then etched back to form spacers 61 on both sides of the cell gate and the PMOS transistor gate. Though not shown in the drawings, a junction region is formed in the high voltage NMOS transistor formation region and a third photoresist PR3 through which only the high voltage PMOS transistor formation region is exposed is then formed. A P+ ion implant process using the third photoresist PR3 as a mask is performed to form first and second P+ junctions 62, 63 within the first and second P− junctions 57, 58, respectively. The third photoresist PR3 is stripped.

Third Embodiment

Figure 4A:
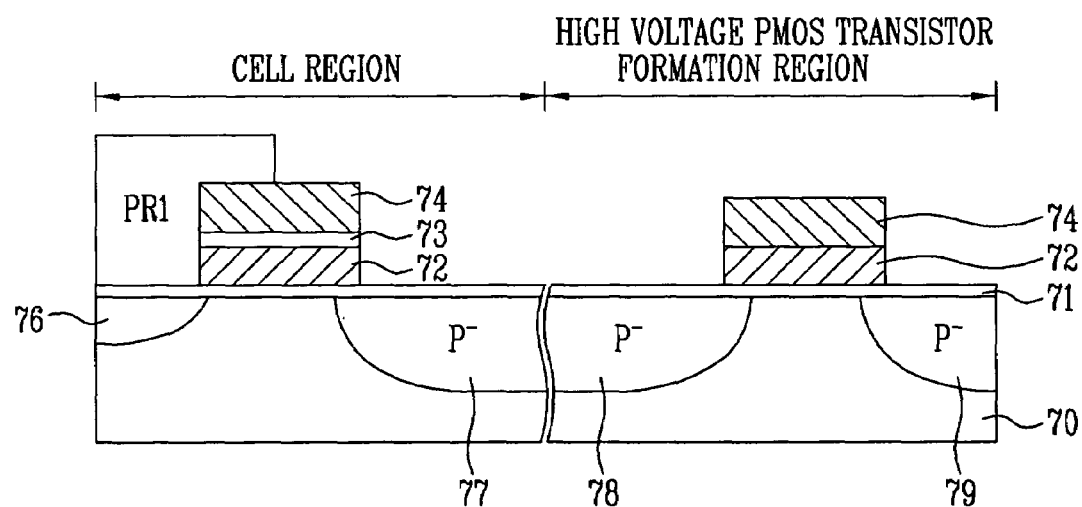
FIGS. 4A to 4C are cross-sectional views illustrating process steps of a method of fabricating a flash memory device according to a third embodiment of the invention.
Figure 4B:
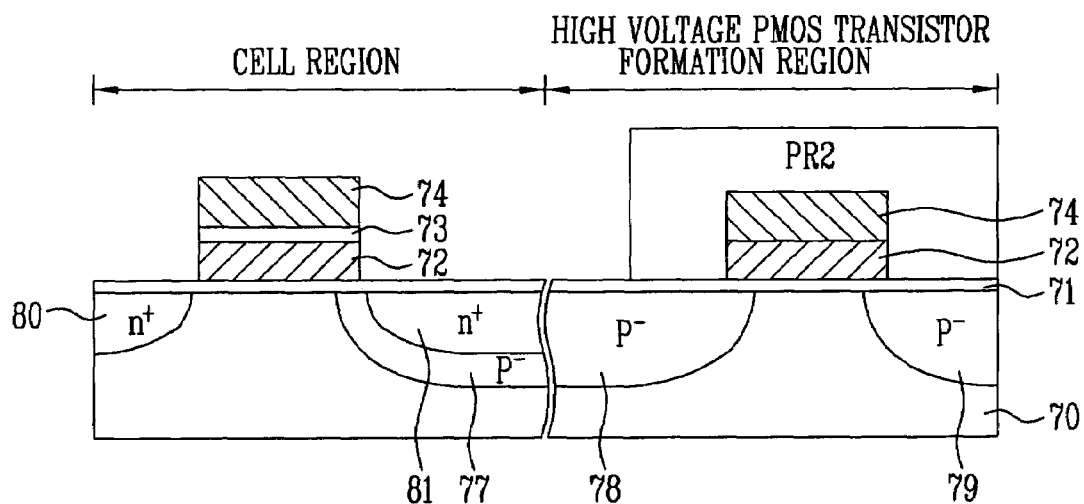
Figure 4C:
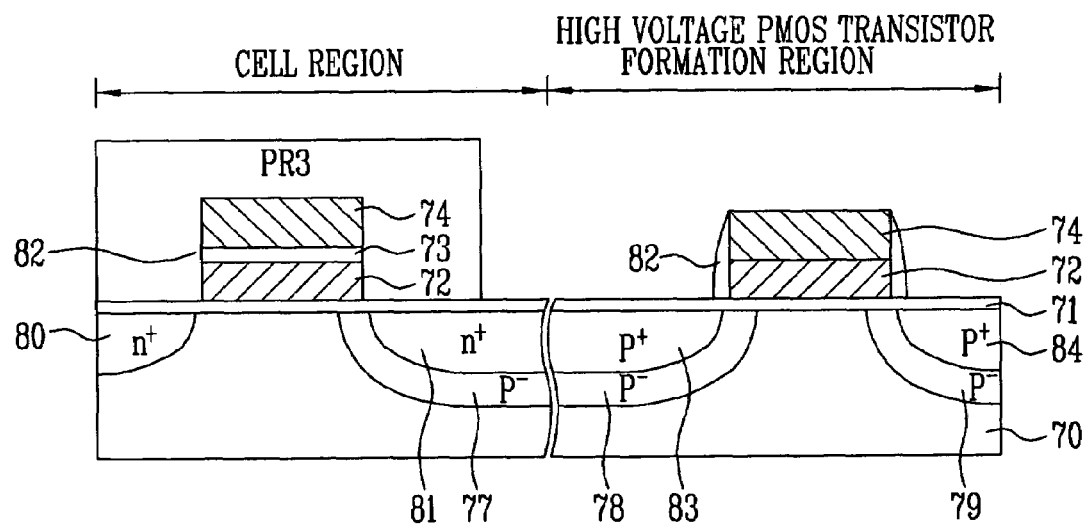

FIGS. 4A to 4C are cross-sectional views illustrating process steps of a method of fabricating a flash memory device according to a third embodiment of the invention. FIG. 4 shows the process of forming the junctions of the cell region and the high voltage PMOS transistor formation region.

As shown FIG. 4A, a tunnel oxide layer 71 is formed on a semiconductor substrate 70 in which an isolation process has been performed. A cell gate in which a floating gate 72, a dielectric layer 73, and a control gate 74 are stacked is formed in a cell region. A PMOS transistor gate in which conduction layers for the floating gate 72 and the control gate 74 are stacked is formed in a high voltage PMOS transistor formation region. A source ion implant process employing a cell source mask is performed to form a source region 76 and an annealing process is then performed. Thereafter, though not shown in the drawings, a DDD ion implant process is performed on the high voltage NMOS transistor formation region.

Thereafter, a first photoresist PR1 through the drain region of the cell region and the high voltage PMOS transistor formation region are exposed is formed. An HVP DDD ion implant process using the first photoresist PR1 as a mask is performed to form a first drain junction 77 in the cell region and first and second P− junctions 78, 79 in the high voltage PMOS transistor formation region. The first photoresist PR1 is stripped.

In the related art, the dose is set to 3.0E13 ions/cm$^3$ to 5.0E13 ions/cm$^3$ in the HVP DDD ion implant process. In this case, however, a depth of an impurity (for example, boron), which is formed in the cell junction, is too deep. Accordingly, there is a possibility that advantages which will be obtained in the embodiments of the present invention may be adversely affected. Accordingly, the dose may be lowered to about 1.0E12 to 2.0E13 ions/cm$^3$.

An SAS etch process, an ion implant process, and an annealing process are then performed to form a common source line.

As shown in FIG. 4B, a second photoresist PR2 through which the cell region is exposed is formed. A cell source/drain ion implant process using the second photoresist PR2 as a mask is performed to form a source junction 80 and a second drain junction 81. The second photoresist PR2 is stripped. The second drain junction 81 is formed within the first drain junction 77. Accordingly, the drain junction of the cell region has a pocket structure.

As shown in FIG. 4C, an insulating layer is deposited on the entire structure and is then etched back to form spacers 82 on both sides of the cell gate and the PMOS transistor gate.

Though not shown in the drawings, a junction region is formed in the high voltage NMOS transistor formation region. A third photoresist PR3 through which only the high voltage PMOS transistor formation region is exposed is then formed. A P+ ion implant process using the third photoresist PR3 as a mask is performed to form first and second P+ junctions 83, 84 within the first and second P− junctions 78, 79, respectively. The third photoresist PR3 is stripped.

As described above, the invention has the following advantages.

When the DDD ion implant process is performed on the high voltage PMOS transistor formation region, ion is also implanted into the junction region of the cell region. Accordingly, the leakage current between the source junction and the drain junction of the cell can be reduced.

Furthermore, in the gate to drain overlap region, since a width of the depletion region reduces, pinch-off can occur rapidly. This can strengthen an electric field of the gate to drain overlap region. Accordingly, hot carriers can be easily generated by the strong electric field and a program characteristic can be improved accordingly.

In addition, when the DDD ion implant process is implemented on the high voltage PMOS transistor formation region, the dose is set to 1.0E12 ions/cm$^3$ to 2.0E13 ions/cm$^3$. At this time, if the junction characteristic of the high voltage PMOS transistor is good, the dose may be increased, if appropriate. In this case, the cell threshold voltage ion implant process may be omitted.

While the invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of fabricating a flash memory device, the method comprising the steps of:

forming transistors in a cell region defining a cell gate, and forming high voltage PMOS and NMOS transistor formation regions defining a PMOS transfer gate and an NMOS transistor gate, respectively, on a semiconductor substrate;

forming a source region by a source ion implant process;

implanting a Double Doped Drain (DDD) ion into the cell region and the high voltage PMOS transistor formation region to form a first source junction and a first drain junction in the cell region and to form first and second P− junctions in the high voltage PMOS transistor formation region;

performing a cell source/drain ion implant process on the cell region to form a second source junction and a second drain junction in the first source junction and the first drain junction, respectively; and forming spacers on the sides of the cell gate and the PMOS transistor gate and the NMOS transistor gate, and performing an ion implant process on the high voltage PMOS transistor formation region to form first and second P+ junctions in the first and second P− junctions.

2. The method of claim 1, further comprising the step of performing a DDD ion implant process on the high voltage NMOS transistor formation region after the source region is formed.

3. The method of claim 1, further comprising the step of performing a self-aligned source etch process, an ion implant process, and an annealing process to form a common source line, after the DDD ion is implanted.

4. The method of claim 1, comprising using in the DDD ion a dose of $1.0E12$ ions/cm$^3$ to $2.0E13$ ions/cm$^3$ in the DDD ion implant process.

5. A method of fabricating a flash memory device, the method comprising the steps of:

forming transistors in a cell region defining a cell gate, and forming high voltage PMOS and NMOS transistor formation regions defining a PMOS transfer gate and an NMOS transistor gate, respectively, on a semiconductor substrate;

forming a source region by a source ion implant process;

implanting a DDD ion into a source region of the cell region and the high voltage PMOS transistor formation region to form a first source junction in the cell region and to form first and second P− junctions in the high voltage PMOS transistor formation region;

performing a cell source/drain ion implant process on the cell region to form a second source junction and a drain junction; and forming spacers on the sides of the cell gate and the PMOS transistor gate and a NMOS transistor gate, and performing an ion implant process on the high voltage PMOS transistor formation region to form first and second P+ junctions within the first and second P− junctions.

6. The method of claim 5, further comprising the step of performing a DDD ion implant process on the high voltage NMOS transistor formation region after the source region is formed.

7. The method of claim 5, further comprising the step of performing a self-aligned source etch process, an ion implant process, and an annealing process to form a common source line, after the DDD ion is implanted.

8. The method of claim 5, comprising using in the DDD ion a dose of $1.0E12$ ions/cm$^3$ to $2.0E13$ ions/cm$^3$ in the DDD ion implant process.

9. A method of fabricating a flash memory device, the method comprising the steps of:

forming transistors in a cell region defining a cell gate, and forming high voltage PMOS and NMOS transistor formation regions defining a PMOS transfer gate and an NMOS transistor gate, respectively, on a semiconductor substrate;

forming a source region by a source ion implant process;

implanting a DDD ion into a drain region of the cell region and the high voltage PMOS transistor formation region to form a first drain junction in the cell region and to form first and second P− junctions in the high voltage PMOS transistor formation region;

performing a cell source/drain ion implant process on the cell region to form a source junction and a second drain junction; and forming spacers on the sides of a cell gate and a PMOS transistor gate and a NMOS transistor gate, and performing an ion implant process on the high voltage PMOS transistor formation region to form first and second P+ junctions within the first and second P− junctions.

10. The method of claim 9, further comprising the step of performing a DDD ion implant process on the high voltage NMOS transistor formation region after the source region is formed.

11. The method of claim 9, further comprising the step of performing a self-aligned source etch process, an ion implant process, and an annealing process to form a common source line, after the DDD ion is implanted.

12. The method of claim 9, comprising using in the DDD ion a dose of $1.0E12$ ions/cm$^3$ to $2.0E13$ ions/cm$^3$ in the DDD ion implant process.

* * * * *